United States Patent [19]
Heegard

[11] Patent Number: 5,162,791
[45] Date of Patent: Nov. 10, 1992

[54] COLLISION DETECTION USING CODE RULE VIOLATIONS OF THE MANCHESTER CODE

[75] Inventor: Chris Heegard, Ithaca, N.Y.

[73] Assignee: Codenoll Technology Corporation, Yonkers, N.Y.

[21] Appl. No.: 416,282

[22] Filed: Oct. 2, 1989

[51] Int. Cl.$^5$ .............................................. H04B 1/00
[52] U.S. Cl. .............................. 340/825.5; 370/94.1; 371/55; 375/55; 375/87
[58] Field of Search ............... 340/825.5; 370/85.2, 370/94.1, 94.3; 371/55, 56, 57.1, 57.2, 67.1, 62; 375/55, 87

[56] References Cited

U.S. PATENT DOCUMENTS

| | | |
|---|---|---|
| 4,063,220 | 12/1977 | Metcalfe et al. |
| 4,282,512 | 8/1981 | Boggs et al. |
| 4,560,984 | 12/1985 | Scholl. |
| 4,561,091 | 12/1985 | Scholl et al. |
| 4,562,582 | 12/1985 | Tokura. |
| 4,701,909 | 10/1987 | Kavehrad et al. |
| 4,727,592 | 2/1988 | Okada et al. ............ 371/62 |
| 4,881,059 | 11/1989 | Saltzberg ............ 375/55 |

Primary Examiner—Donald J. Yusko
Assistant Examiner—Dervis Magistre
Attorney, Agent, or Firm—Pennie & Edmonds

[57] ABSTRACT

A collision detection method and apparatus is disclosed for detecting code rule violations in Manchester encoded data packets. The signals $$\delta_0 = S_{2n} - S_{2n-1}$$

$$\delta_1 = S_{2n+1} - S_{2n}$$

$$\delta_2 = S_{2n+1} - S_{2n-1}$$

$$\sigma_0 = S_{2n} + S_{2n-1}.$$

are determined at time nT where $S_{2n-1}$ and $S_{2n}$ are the Manchester code bit pair representative of the nth bit in a data stream having a bit period T. Processing of these signals permits the detection of most collisions since the Manchester coding rules are violated more than half the time in the signal formed by the colliding packets. To ensure 100% collision detection, a preamble using an intentional violation of the Manchester code in the pattern 10 11 01 10 is advantageously used in each data packet and a collision is signaled upon detection of two or more coding violations.

9 Claims, 1 Drawing Sheet

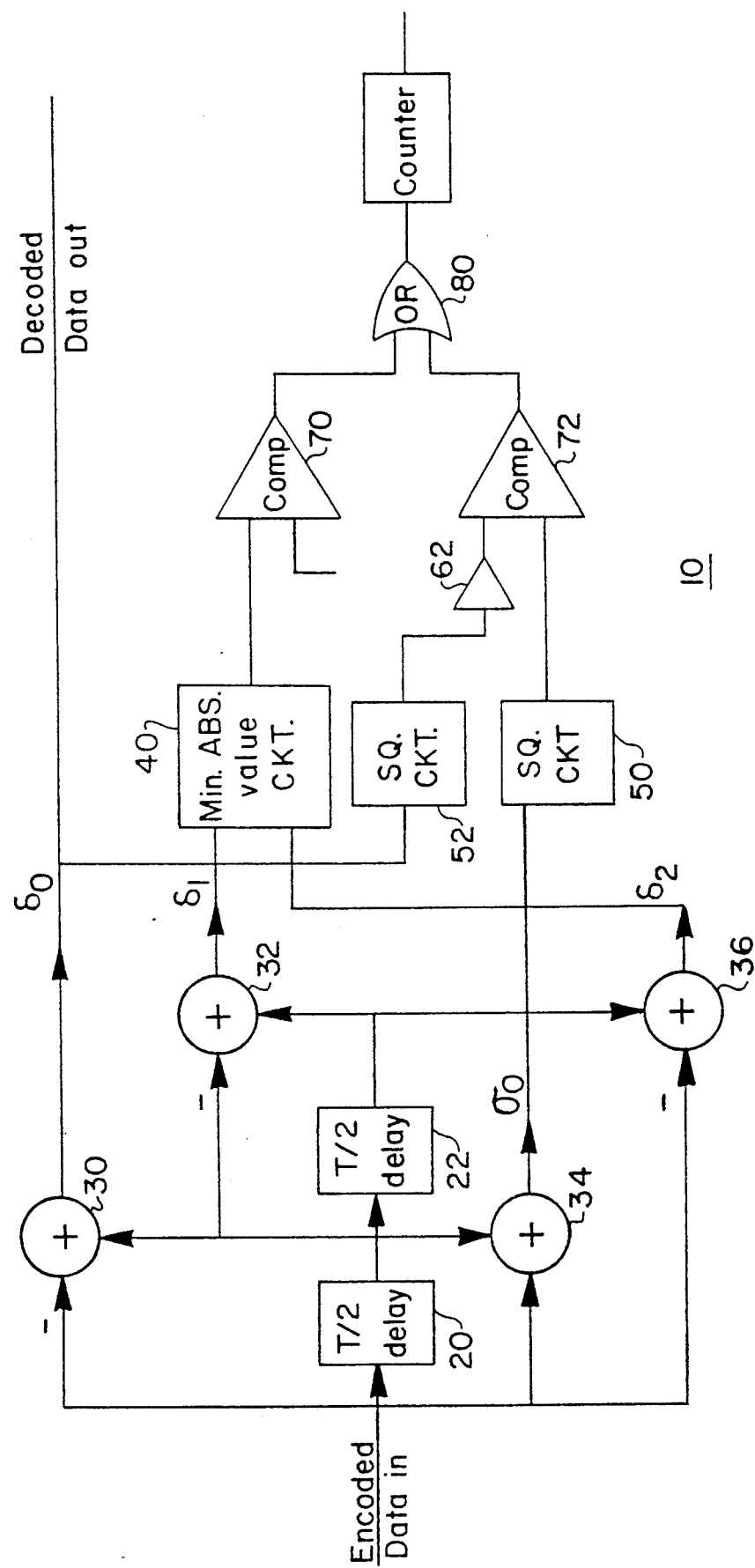

COLLISION DETECTION USING CODE RULE VIOLATIONS OF THE MANCHESTER CODE

BACKGROUND OF THE INVENTION

The present invention relates to a method and apparatus for detecting when a collision occurs between two or more binary data signal packets in a communication network.

Two communication technologies are in general use, circuit switching and packet switching. Communications over the switched public telephone line are illustrative of the circuit switching technique, and the Ethernet system is typical of the packet switching technique.

The circuit switching technique establishes a connection between two terminals only when a message is to be transmitted. However, because the time required to establish a connection may be very large compared to the actual time of a communication, especially in the case of a short communication, this technique is slow, inefficient and expensive.

In contrast, the packet switching technique maintains the communications connection but transmits the message in the form of packets of binary information. Short communications are transmitted by a single packet while longer or bursty communications are transmitted by a series of packets. Computer communications lend themselves to packet switching techniques because computer communications are characteristically in the form of short bursts of binary information.

The packet is typically divided into two primary sections, the header and the data, each of which has a different purpose. The header is the portion of the packet which is initially received and contains such information as the address to which the packet is to be sent, the address of the sender of the packet and other information that the particular system requires. Following the header is the data section where the substance of the communication is contained either wholly for a short communication, or partially for a longer communication. The packet may include an additional section which follows the data section which contains information relating to error checks or to packet linking. Packets typically are about 60 microseconds in duration. Data rates in the Ethernet system, for example, are 10 Megabits/second so that a single bit has a pulse width or duration of 100 nanoseconds and a packet contains about 6,000 bits.

In a typical packet switching system numerous terminals are connected to the same communication network and can access the network at the same time. As a result, it is possible that packet collisions will occur because more than one terminal transmits a packet at the same time. When a collision of packets is detected, an instruction is sent to retransmit the original data so that another attempt may be made to receive the packet without a collision. If a collision of packets is not detected, the information transmitted is lost since the signal received is unintelligible as it is a sum of the overlapping packets.

Numerous techniques are known in the art for detecting a data collision. Ordinarily, these techniques are implemented at each terminal that is transmitting a data packet. In U.S. Pat. No. 4,063,220, an exclusive OR gate at a signal transmitter compares the transmitted signal with the signal present on the communication cable and aborts transmission when they are not the same. Another technique is to monitor the DC level of the signal received from the communication line and, if this level is higher than a specified thereshold, assume there is a data collision. Alternatively, as disclosed, for example, in U.S. Pat. No. 4,282,512, the receiver can look for data transitions that occur at timings different from those expected for the received data.

U.S. Pat. No. 4,561,091 discloses a data communications receiver with a collision detection circuit for comparing a signal from a timing circuit with the received data signal. The receiver produces a collision detection signal when the received data signal fails to change within the duration of the output signal from the timing circuit which is set equal to the longest data signal interval.

U.S. Pat. No. 4,560,984 discloses a method for detecting the collision of data packets in which a signal pulse, having an amplitude much larger than a data pulse, is substituted for the initial bit of the packet. The receiver tests for a pulse much larger than a data pulse. If two large signal pulses are received within a time period less than or equal to the sum of the duration of the packet and the time period between packets, a collision has occurred.

However, the above methods do not detect collisions for certain conditions. For example, the above methods do not detect the collision of two signals which arrive at the receiver at approximately the same time. In addition, the above methods do not always detect collisions that may arise involving an attenuated signal. In optical communication systems, it has been found that up to a 26 dB loss (i.e. 99.7% decrease) of optical power may occur between the signal transmitted and the signal received. This loss of power may arise due to the length of transmission and the connectors or repeaters the signal passes through. In some cases of collision, the amplitude difference between two attenuated signals may be as much as 8 dB. This difference is so great that the smaller signal has little effect on the larger signal and the collision is undetectable by current collision detection techniques. These problems of detecting attenuated signals are increasing as communication systems switch to optical fibers.

U.S. Pat. No. 4,701,909 discloses a method for detecting collisions by using fixed Hamming weight sequences in the preamble of the data packet. If two packets collide, the received sequence presumably would be altered enough that a sequence weight violation could be detected.

U.S Pat. No. 4,562,582 discloses a method for detecting collisions by detecting certain code rule violations in a "Double Manchester" code sequence. Manchester code is a simple mapping of binary data into coded data at rate of 1 to 2 (i.e., each symbol of binary data is mapped to two symbols of coded data). Typically a 1 bit is mapped to 01 and a 0 bit is mapped to 10. Thus, a symbol pair having a positive going transition between the symbols is associated with the 1 bit and a symbol pair having a negative going transition is associated with the 0 bit. Since each symbol pair has a zero value and a one value, Manchester coding provides run-length limiting and zero/one balancing. A Double Manchester code sequence is one in which the Manchester encoder is applied twice to the data in the packet so that binary data is mapped into coded data at a rate of 1 to 4. While the method of the '582 patent detects some code rule violations, it does not detect all possible code rule violations, is unnecessarily complicated and involves a highly redundant encoding (i.e., 1 to 4) of the data.

SUMMARY OF THE INVENTION

The present invention relates to a method and apparatus for data detection and collision detection for Manchester coded packets. The detection of data and collision in a coded modulation packet system is possible via the use of partial response demodulation and the detection of violations of the coding rules that describe the Manchester coded signal. In a preferred embodiment, the present invention can achieve 100% collision detection in the absence of noise.

Given a data stream specified by the sequence $X_1, X_2, X_3, \ldots, X_j$ where $X_j$ is a binary data bit having a value of either 0 or 1 (i.e., $X_j \epsilon \{0,1\}$), the Manchester coded data stream is represented by the sequence $\overline{X}_1, X_1, \overline{X}_2, X_2, \ldots$, where $\overline{X}_j$ is the complement of $X_j$. If we assume that the duration of each symbol in the input binary data stream is T seconds, then the duration of each symbol in the Manchester coded data stream is T/2 seconds (i.e., at 10 Mbps, T=100 ns and T/2=50 ns).

In partial response demodulation (or detection), the data bits that are encoded in a signal are extracted from the encoded signal by a "partial-response" (PR) filter. In the case of Manchester coding, the PR filter that is used for data detection is one that subtracts the first symbol of each symbol pair from the second symbol of that pair. In a practical filter this is accomplished by subtracting from the encoded signal a copy of the encoded signal that has been delayed by the duration of one coded symbol (i.e. by T/2 seconds). When the resulting signal is sampled at the appropriate time, once per data bit time T (e.g., once every 100 ns in the Ethernet system described above), the sign of the result indicates the value of the data bit. This follows from the fact that $$X_j - \overline{X}_j = \begin{matrix} +1 \text{ where } X_j = 1 \\ -1 \text{ where } X_j = 0. \end{matrix}$$

Given any coded modulation system, there exist invariants of the code that must be satisfied by a valid signal. In accordance with the invention, these invariants are used for detection of signal collision because a collision can be declared if the invariants of the code are violated. To understand this method of collision detection, consider the following. Suppose that a binary sequence $Z_1, Z_2, Z_3, \ldots$ is to be tested to determine if it is the output of a Manchester encoder. One method is to check that the following inequalities are satisfied: $Z_2 \neq Z_1, Z_4 \neq Z_3$, etc. or equivalently, $Z_3 - Z_2 \neq Z_3 - Z_1$, $Z_5 - Z_4 \neq Z_5 - Z_3$, etc. A violation of the Manchester coding rules occurs if both $Z_3 - Z_1 \neq 0$ and $Z_3 - Z_2 \neq 0$. Detection of violations of this type is the main method of collision detection employed in the present invention.

In accordance with the invention, a simple invariant of the Manchester code can be described in terms of the valid outputs of a pair of partial response filters. The first filter is the same as the one used for data detection, except the outputs are sampled at a time that is exactly between the instants in which the data is detected (i.e., ½ of a bit time, T/2, after the data detection instant or 50 ns in the Ethernet system described above). In effect this filter calculates $Z_3 - Z_2$. The second PR filter subtracts the first symbol of each symbol pair from the first symbol of the next symbol pair in the encoded sequence. In effect, this filter calculates $Z_3 - Z_1$. In a practical filter this is accomplished by subtracting from the encoded signal a copy of the encoded signal that is delayed by two coded symbols. At the proper times, once per bit time, one (and only one) of the outputs of the two PR filters must be equal to zero. This is an invariant of the Manchester code. If this invariant is violated, a collision is reported.

More particularly, let the $n^{th}$ binary bit, $X_n$, of a data stream be encoded as a symbol pair. If no collision occurs during transmission of this symbol pair through the communication network, this symbol pair produces the signals $S_{2n-1}, S_{2n}$ in a sequence of encoded symbols received from the communication network. In accordance with the invention, the following four values are computed at each time nT:

$$\delta_0 = S_{2n} - S_{2n-1}$$

$$\delta_1 = S_{2n+1} - S_{2n}$$

$$\delta_2 = S_{2n+1} - S_{2n-1}$$

$$\sigma_0 = S_{2n} + S_{2n-1}.$$

From these four signals, the data is detected and a test for a possible collision is made.

The data is detected by computation of the first of these values because in the absence of an interfering signal (and noise) $\delta_0 = A(X_n - \overline{X}_n)$ where A is the signal gain of the data packet in the transmission system and $X_n$ and $\overline{X}_n$ are the complementary symbols of the nth symbol pair. Thus, an estimate of the value of $X_n$ is 1 if $\delta_0$ is greater than zero and 0 if $\delta_0$ is less than zero or more formally:

$$\hat{X}_n = \begin{matrix} 1 \text{ if } 0 < \delta_0; \\ 0 \text{ if } \delta_0 < 0. \end{matrix}$$

A collision is declared if for two positive parameters $\Delta, \Gamma$:

$$\min(|\delta_1|, |\delta_2|) > \Delta$$

or $$\sigma_0^2 > (1+\Gamma)\delta_0^2 \text{ (d.c. coupled receiver)}$$

$$\sigma_0^2 > \Gamma \delta_0^2 \text{ (a.c. coupled receiver)}.$$

The first of these tests is the test for the Manchester code rule violation described above. The second of these tests accounts for a special case that arises where the signal gains of two colliding packets are the same and the second symbol of one symbol pair and the first symbol of the next symbol pair are both one bits.

Specific apparatus for implementing these tests comprise two delay circuits connected in series for producing delays of one symbol each and four signal adders for combining the delayed signals and the undelayed signal to generate the sum and differences $\sigma_0, \delta_0, \delta_1, \delta_2$. The apparatus also includes means for determining the minimum of $|\delta_1|, |\delta_2|$ and comparing such value with zero and means for comparing $\sigma_0^2$ and $\delta_0^2$.

Detection of code rule violations as above should make it possible to detect most packet collisions in a very short time. However, to ensure 100% collision detection it is necessary to provide coding in each transmitted packet that guarantees a violation of the Manchester coding rules.

In particular, proper choice of a packet preamble insures that the collision detection algorithm described above will indicate the presence of one or more interfering packets. In a preferred embodiment of the invention, the packet preamble comprises three essential fields: a SYNC word (nominally four data bits long or 400 ns at 10 Mbps), a CRV (Code Rule Violation) word (four data bits long or 400 ns) and a Unique word (UW) (nominally 32 data bits long or 3200 ns). The SYNC pattern is a fixed pattern of eight symbols, presently defined in industry standards to be a Manchester encoding of the four data bits 1 1 0 which are encoded as: 01 10 01 10. In accordance with the invention, the CRV pattern is a fixed pattern of eight symbols that violate the invariants of the Manchester code. Preferably this pattern is: 10 11 01 10. The UW pattern is unique to each transmitter and is Manchester encoded. The purpose of the unique word is a signature to cause Manchester coding violations for the case when the colliding packets arrive simultaneously. Colliding packets that do not arrive simultaneously are detected by the interference of the CRV word with properly encoded Manchester bits.

The CRV pattern is designed to produce a single code-rule violation in a legitimate (i.e., non-colliding) packet. When two (or more) packets collide, two or more code-rule violations will occur. It is this event that ensures 100% collision detection. If the packets arrive with nonzero relative delay, the CRV pattern will provide at least the two required violations of the Manchester invariants. In the special case of zero relative delay, the UW pattern will provide for collision detection. The UW is designed to guarantee a minimum number of code-rule violations and a large average number of opportunities for collision detection. It is important to note that this method is proven to have 100% collision detection (in the absence of noise) with all choices of relative delay between colliding packets.

The advantages of such a system include: improved signal to noise ratio (SNR), efficient bandwidth usage, and a provable, 100% collision detection mechanism, with a fast average time to collision detection and a lower complexity of computation per unit time when compared to "Double Manchester". The costs associated with this scheme is a slightly more complex detection algorithm than is needed simply to extract only the packet data. However, this increase in detector complexity is traded for lower sensitivity required of the photodetector (i.e., SNR) as well as the simplicity of the packet format (i.e., the preamble is simple and the bulk of the packet is compatible with the existing, Manchester coded packet format) when compared to other schemes. Furthermore, when this method is compared to schemes based on "Double Manchester" code the number of computations per second is actually lower. This follows from the fact that for a given packet data rate, the clock period of Double Manchester is half the clock period of Manchester code.

BRIEF DESCRIPTION OF DRAWING

These and other objects, features and advantages of the invention will be more readily apparent from the following detailed description of the invention in which the drawing depicts an illustrative circuit for the practice of the invention.

DETAILED DESCRIPTION

A schematic diagram of an illustrative circuit 10 for practicing the invention is set forth in the drawing. As shown therein, circuit 10 comprises first and second signal delay means 20, 22, first, second, third and fourth summing means 30, 32, 34, 36, a minimum absolute value circuit 40, squaring circuits 50, 52, amplifier 62, first and second comparators 70, 72, OR gate 80 and counter 90.

Circuit 10 computes the following four values at each time nT $$\delta_0 = S_{2n} - S_{2n-1}$$

$$\delta_1 = S_{2n+1} - S_{2n}$$

$$\delta_2 = S_{2n+1} - S_{2n-1}$$

$$\sigma_0 = S_{2n} - S_{2n-1}.$$

where $S_{2n-1}$ and $S_{2n}$ are a symbol pair representing the $n^{th}$ binary bit of the data stream and T is the data bit period of the data stream (e.g., 100 ns in the Ethernet system described above). From these four signals, the data is detected and a test for a possible collision is made.

The data is detected by noting that in the absence of an interfering signal (and noise) $\delta_0 = A(X_n - \bar{X}_n)$. Thus $$X_n = \begin{matrix} 1 & 0 < \delta_0; \\ 0 & \delta_0 < 0. \end{matrix}$$

A collision is declared if (for two positive parameters $\delta$, $\Gamma$)

$$\min(|\delta_1|, |\delta_2|) > \Delta$$

or $$\sigma_0^2 > (1 + \Gamma)\delta_0^2 \text{ (d.c. coupled receiver)}$$

$$\sigma_0^2 > \Gamma \delta_0^2 \text{ (a.c. coupled receiver).}$$

As shown in the drawing, a received signal from a communication network is applied to delay means 20 and to summing means 30, 34, 36. A delayed signal from delay means 20 is provided to delay means 22 and to summing means 30, 32, 34. A delayed signal from delay means 22 is supplied to summing means 32, 36. Summing means 30 subtracts the received signal from the signal from delay means 20 and produces the output signal $\delta_0$, summing means 32 subtracts the delayed signal from delay means 22 to produce the output signal $\delta_1$, summing means 36 subtracts the received signal from the delayed signal means 22 to produce the output signal $\delta_2$, summing means 34 adds the received signal and the delayed signal from delay means 20 to produce the output signal $\sigma_0$. The signals $\delta_1$ and $\delta_2$ from summing means 32 and 36 are applied as inputs to minimum value circuit 40 which determines the minimum of the absolute values of the two input signals. The output of minimum value circuit 40 is applied to comparator 70 which compares the minimum absolute value with a predetermined positive value. The signal $\sigma_0$ from summing means 34 and the signal $\delta_2$ from summing means 36 are each applied to squaring circuits 50, 52. These signals are squared and applied to comparator 72. In addition, the output of squaring circuit 52 is amplified by the factor $\Gamma$ or $(1+\Gamma)$.

The outputs of comparators 70, 72 are applied to OR gate 80. The output of OR gate 80 is a signal which is high when a violation in the Manchester coding has been detected. As shown in the drawing, this signal is applied to counter 90 which counts the number of code violations detected.

To understand this method of collision detection, consider a collision of two Manchester encoded packets X, Y. Let the legitimate packet be encoded as $\overline{X}_1$, $X_1$, $\overline{X}_2$, $X_2$, ..., and the colliding packet at $\overline{Y}_1$, $Y_1$, $\overline{Y}_2$, $Y_2$, ... In a collision, the scaled values of the X packet are added to a scaled and delayed version of the Y packet. There are two important, extreme, cases that must be considered: "out of phase" (i.e., a collision in which the two packets are displaced an odd number of symbol positions relative to one another) and "in phase" (i.e., a collision in which the two packets are displaced zero or an even number of symbol positions relative to one another).

As an example of an "out of phase" collision, assume the collision results in the sequence $S_{2n-1} = A\overline{X}_n + BY_n$, $S_{2n} = AX_n + B\overline{Y}_{n+1}$, $S_{2n+1} = A\overline{X}_{n+1} + BY_{n+1}$ where $A > 0$ is the signal gain of the first packet and $B > 0$ is the signal gain of the interfering second packet. Whenever $Y_n = \overline{Y}_{n+1}$ or $X_n = \overline{X}_{n+1}$, these collisions can be detected by testing for Manchester code rule violations. In particular, there are two cases that must be considered:

(1) If $A >> B$ or $A << B$ and (2) if $A \approx B$.

If $A >> B$ or $A << B$ then       (1)

$$|\delta_1| = |S_{2n-1} - S_{2n}| = |A(X_{n+1} - X_n + B(Y_{n+1} - Y_{n+1}))|$$

$$|\delta_2| = |S_{2n+1} - S_{2n-1}| = |A(X_{n+1} - X_n) \\ B(Y_{n+1} - Y_n)|$$

In this case, if $Y_n = \overline{Y}_{n+1}$ it can be shown that $$min(|\delta_1|, |\delta_2|) = min(B, |A \pm B|).$$

Alternatively, if $Y_n \neq \overline{Y}_{n+1}$ but $X_n = \overline{X}_{n+1}$, it can be shown that $$min(|\delta_1|, |\delta_2|) = min(B, A)$$

In both cases the minimum are positive if $B > 0$.

(2) In a d.c. coupled receiver, if $A \approx B$, and $\overline{Y}_{n+1} = Y_n = 1$, then $$\sigma_0 =$$

$$S_{2n} + S_{2n-1} = |A(X_n + X_n) + B(Y_{n+1} + Y_n)| = A + 2B \approx 3A$$

while $$|\delta_0| = S_{2n} - S_{2n-1} = |A(X_n - X_n)| = A.$$

Thus $\sigma_0 \approx 3|\delta_0|$. (Note that for $B = 0$, $\sigma_0 = |\delta_0|$.)

In the more usual case of an a.c. coupled receiver (i.e., the signals are d.c. free), we take $X_j \epsilon \{\frac{1}{2}, -\frac{1}{2}\}$. Then, if $A \approx B$ and $Y_n = \overline{Y}_{n+1}$, then $$|\sigma_0| =$$

-continued
$$|S_{2n} + S_{2n-1}| = |A(X_n + X_n) + B(Y_{n+1} + Y_n)| = B \approx A$$

while $$|\delta| = |S_{2n} - S_{2n-1}| = |A(X_n - X_n)| = A$$

Thus $|\sigma_0| \approx |\delta|$. (Note that for $B = 0$, $\sigma_0 = 0$.)

As an example of an in phase collision, assume the collision results in the sequence $S_{2n-1} = AX_n + BY_n$, $S_{2n} = A\overline{X}_n + B\overline{Y}_n$, $S_{2n+1} = AX_{n+1} + BY_{n+1}$ where $A > 0$ is the signal gain of the first packet and $B > 0$ is the signal gain of the second packet. Then $$|\delta_1| = |S_{2n+1} - S_{2n}| = |A(X_{n+1} - \overline{X}_n) + B(Y_{n+1} - \overline{Y}_n)|$$

$$|\delta_2| = |S_{2n+1} - S_{2n-1}| = |A(X_{n+1} - X_n) + B(Y_{n+1} - Y_n)|$$

In this case, if $|\overline{X}_{n+1} - \overline{X}_n| - X_n| \neq |\overline{Y}_{n+1} - \overline{X}_n|$ then $$min(|\delta_1|, |\delta_2|) = min(B, A)$$

which is $> 0$ if $B > 0$ (if $B = 0$, the minimum is 0).

In practice, the relative delay can be arbitrary (i.e., not a multiple of half the bit period, T/2). However, the methods that are described for collision detection in the two extreme cases will detect collision for arbitrary delay relationships.

When two random Manchester encoded, packets collide, the above rules will be violated more than one half the time (i.e., for random packets half of the bits will cause collision detector circuit 10 to detect a violation). This comes from the fact that for random data the frequency of $\overline{Y}_1 = Y_2$ and the frequency of $|Y_1 - Y_2| \neq |X_1 - X_2|$ are both $\frac{1}{2}$. This ensures that the average time to collision detection will be small. However, to ensure 100% collision detection, the packet preamble is advantageously modified to provide guaranteed violation of the Manchester coding rules. In accordance with the invention, the packet preamble for 100% collision detection comprises three essential fields: a SYNC word (illustratively four data bits long or 400 ns @ 10 Mbps), a CRV word (four data bits long or 400 ns) and a Unique word (UW, illustratively 32 data bits long or 3200 ns). The SYNC pattern is a fixed four bit word, illustratively a Manchester encoding of 1 0 1 0 (encoded: 01 10 01 10). The CRV pattern is a fixed pattern of eight code bits that violate the invariants of the Manchester code (encoded: 10 11 01 10). Note that it is the design of this pattern that guarantees collision detection. The last UW pattern is illustratively a 32 bit word that is unique to each transmitter and is Manchester encoded. All portions of the packet are Manchester encoded except the CRV words which are chosen to deliberately cause the collision detector to find a violation. The purpose of the unique word is to cause Manchester coding violations for the case when the packets arrive with no differential delay. All other delays are detected by the interference of the CRV word with properly encoded Manchester bits.

The CRV pattern is designed to produce a single code-rule violation in a legitimate (i.e., non-colliding) packet. When two (or more) packets collide, two or more code-rule violations will occur. These code rule violations are counted by counter 90 and an output signal is produced as soon as the count reaches two. It is this event that ensures 100% collision detection. If the packets arrive with nonzero relative delay, the CRV pattern will provide the required violation of the Manchester invariants. In the special case of zero relative delay, the overlapping UW patterns in the two colliding packets will generate the code rule violations that provide for collision detection. In particular, the UW is designed to guarantee a minimum number of code-rule violations and a large average number of opportunities for collision detection.

It is important to note that this method is proven to have 100% collision detection (in the absence of noise) with all choices of relative delay between colliding packets.

In experimental tests performed on a star-coupled fiber optic network, the invention was used to detect collisions between a continuous stream of data from one fiber optic transmitter and an eight bit data packet from a second fiber optic transmitter. The signals from the two transmitters were combined by the star coupler and provided to a fiber optic receiver and collision detector incorporating the present invention. Several experimental runs were performed, each involving the collision of tens of millions of such packets with the continuous data stream. In these runs, there were different losses in the power in both signals and the difference in received signal power between the two signals was as great as 11.3 dB. The results revealed no missed collisions and no false collisions.

As will be apparent to those skilled in the art, numerous modifications may be made in the above described method and apparatus that are within the spirit and scope of the invention.

What is claimed is:

1. A method for detecting collisions among packets of Manchester coded binary data transmitted over a communication network comprising the steps of:
   receiving from said communication network packets of Manchester coded binary data,
   generating at each time nT from a received packet of Manchester coded binary data signals four signals:

$\delta_0 = S_{2n} - S_{2n-1}$ $\delta_1 = S_{2n+1} - S_{2n}$ $\delta_2 = S_{2n+1} - S_{2n-1}$ $\sigma_0 = S_{2n} + S_{2n-1}$ where $S_{2n-1}$ and $S_{2n}$ are a symbol pair representing an nth binary bit of a data stream represented by the data packet and T is the bit time period in the data stream,
   determining if a minimum of $|\delta_1|$, $|\delta_2|$ is greater than a positive constant,
   determining if $\sigma_0^2$ is greater than $k\delta_0^2$ where k is a positive constant and
   generating a collision detect signal if the minimum of $|\delta_1|$, $|\delta_2|$ is greater than a positive constant or if $\sigma_0^2$ is greater than $k\delta_0^2$.

2. The method of claim 1 wherein the data packet includes a preamble which contains a signature that is unique for each transmitter from which a data packet is sent, said method further comprising the step of testing the signature for invalidity in the received data packet.

3. The apparatus of claim 1 wherein the data packet includes a preamble which contains the code bits 10 11 01 10.

4. A apparatus for determining collisions among packets of Manchester coded binary data in which each packet is represented by a sequence of Manchester coded symbols comprising:
   means for receiving packets of Manchester coded binary data,
   first, second, third and fourth summing means, first and second delay means, each delay means delaying symbols in an input signal by a duration equal to the duration of a symbol in a Manchester coded packet,
   the symbols in a received binary data packet being provided to inputs to said first, second and third summing means and said first delay means,
   the symbols in an output from said first delay means being provided to inputs to said second delay means and to said first, second and fourth summing means,
   said first summing means subtracting the symbols in the received data packet from the symbols in the output of the first delay means,
   said second summing means adding the symbols in the received data packet from the symbols in the output of the first delay means,
   said third summing means subtracting the symbols in the received data packet from the symbols in the output of the second delay means,
   said fourth summing means subtracting the symbols in the output of the first delay means from the symbols in the output of the second delay means,
   means for squaring an output from each of the first and second summing means and for comparing the squared outputs,
   means for determining if a minimum of an absolute value of an output from each of third and fourth summing is greater than zero, and
   means for generating a collision detect signal if the squared output of the second summing means is grater than a product of a positive constant times the squared output of the first summing means or if the minimum of the absolute values of the outputs from the third and fourth summing means is greater than zero.

5. The apparatus of claim 4 further comprising means for counting the number of collision detect signals and generating an output upon counting two or more such signals.

6. The apparatus of claim 4 wherein the data packet includes a preamble which contains the code bits 10 11 01 10.

7. A apparatus for determining collisions between packets of Manchester coded binary data in which each bit of data is represented by a Manchester coded symbol pair comprising:
   means for receiving packets of Manchester coded binary data,
   first, second, third and fourth summing means,
   first and second delay means, each delay means delaying symbols in an input signal by a duration equal to the duration of one Manchester coded symbol,
   the symbols in a received binary data packet being provided to inputs to said first, second and third summing means and said first delay means,
   the symbols in an output from said first delay means being provided to inputs to said second delay means and to said first, second and fourth summing means, said first summing means subtracting the symbols in the received data packet from the symbols in the output of the first delay means, said second summing means adding the symbols in the received data packet to the symbols in the output of the first delay means, said third summing means subtracting the symbols in the received data packet from the symbols in the output of the second delay means, said fourth summing means subtracting the symbols in the output of the first delay means from the symbols in the output of the second delay means, means for squaring an output from each of the first and second summing means and for comparing the squared outputs, means for determining if a minimum of an absolute value of an output from each of third and fourth summing is greater than zero, and means for generating a collision detect signal if the squared output of the second summing means is grater than a product of a positive constant times the squared output of the first summing means or if the minimum of the absolute values of the outputs from the third and fourth summing means is greater than zero.

8. The apparatus of claim 7 further comprising means for counting the number of collision detect signals and generating an output upon counting two or more such signals.

9. The apparatus of claim 7 wherein the data packet includes a preamble which contains the code bits 10 11 01 10.

* * * * *